(12) United States Patent
Rezanezhad Gatabi

(10) Patent No.: US 9,166,006 B1
(45) Date of Patent: Oct. 20, 2015

(54) METHODS TO IMPROVE THE PERFORMANCE OF COMPOUND SEMICONDUCTOR DEVICES AND FIELD EFFECT TRANSISTORS

(71) Applicant: Iman Rezanezhad Gatabi, Sunnyvale, CA (US)

(72) Inventor: Iman Rezanezhad Gatabi, Sunnyvale, CA (US)

(73) Assignee: Iman Rezanezhad Gatabi, Sunnyvale, CA (US)

( * ) Notice: Subject to any disclaimer, the term of this patent is extended or adjusted under 35 U.S.C. 154(b) by 0 days.

(21) Appl. No.: 14/327,559

(22) Filed: Jul. 9, 2014

Related U.S. Application Data

(60) Provisional application No. 61/940,431, filed on Feb. 16, 2014, provisional application No. 61/913,381, filed on Dec. 8, 2013.

(51) Int. Cl.
  *H01L 29/00* (2006.01)
  *H01L 21/00* (2006.01)
  *H01L 29/20* (2006.01)
  *H01L 29/778* (2006.01)
  *H01L 29/66* (2006.01)
  *H01L 21/285* (2006.01)

(52) U.S. Cl.
  CPC ........ *H01L 29/2003* (2013.01); *H01L 29/7787* (2013.01); *H01L 21/28587* (2013.01); *H01L 29/66462* (2013.01)

(58) Field of Classification Search
  CPC ............ H01L 29/2003; H01L 29/7787; H01L 29/64622; H01L 21/28587; H01L 21/38575; H01L 21/38581; H01L 29/666462
  See application file for complete search history.

(56) References Cited

U.S. PATENT DOCUMENTS

| | | | | |
|---|---|---|---|---|
| 5,742,077 | A * | 4/1998 | Patel et al. | 257/194 |
| 6,943,386 | B2 * | 9/2005 | Tsai | 257/190 |
| 7,875,907 | B2 * | 1/2011 | Honea et al. | 257/192 |
| 7,884,394 | B2 * | 2/2011 | Wu et al. | 257/194 |
| 7,898,004 | B2 * | 3/2011 | Wu et al. | 257/194 |
| 8,035,128 | B2 * | 10/2011 | Ikeda et al. | 257/192 |
| 8,415,673 | B2 * | 4/2013 | Furukawa | 257/66 |
| 8,735,943 | B2 * | 5/2014 | Senda et al. | 257/194 |
| 8,907,378 | B2 * | 12/2014 | Teo et al. | 257/194 |
| 2004/0262626 | A1 * | 12/2004 | Tsai | 257/103 |
| 2009/0065810 | A1 * | 3/2009 | Honea et al. | 257/192 |
| 2010/0140660 | A1 * | 6/2010 | Wu et al. | 257/183 |
| 2011/0220894 | A1 * | 9/2011 | Furukawa | 257/57 |
| 2013/0093006 | A1 * | 4/2013 | Senda et al. | 257/330 |
| 2014/0266324 | A1 * | 9/2014 | Teo et al. | 327/109 |

* cited by examiner

*Primary Examiner* — Nikolay Yushin

(57) ABSTRACT

Three methods will be described which may be used to improve the performance of compound semiconductor devices and Field Effect Transistors. In the first method, implementation of more than one sheet of 2DEG or high-density electrons in compound semiconductor devices will be described which may be used to improve the performance of compound semiconductor diodes, resistors and transistors. In the second method, implementation of at least one discontinuity in sheet or sheets of 2DEG or high-density electrons will be discussed which can be used to improve the performance of compound semiconductor diodes, resistors and transistors. In the third method, a way to form an electrical connection between an electrode and a sheet of 2DEG or high density electrons will be presented which may be implemented in compound semiconductor devices to reduce the contract resistance between an electrode and a sheet of 2DEG or high-density electrons.

19 Claims, 27 Drawing Sheets

- Prior Art -

- Prior Art -

- Prior Art -

METHODS TO IMPROVE THE PERFORMANCE OF COMPOUND SEMICONDUCTOR DEVICES AND FIELD EFFECT TRANSISTORS

CROSS-REFERENCE TO RELATED APPLICATIONS

This application claims the benefits of U.S. Provisional Application No. 61/940,431 filed on Feb. 16, 2014.

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISC APPENDIX

Not Applicable.

BACKGROUND OF THE INVENTION

Compound semiconductor devices and Field Effect Transistors (FETs) are key components in today's electronic systems. They are widely-used in electronic circuits and improving their characteristics is exceedingly important to achieve high-performance electronics. Improving the characteristics of these devices like their ON-state resistance ($R_{ON}$), drive current and speed are key factors to improve the energy-efficiency and speed of electronic systems. Three methods are presented in this document which can be applied to improve the performance of FETs and compound semiconductor devices as will be discussed.

BRIEF SUMMARY OF THE INVENTION

Three methods are presented to improve the performance of compound semiconductor devices and Field Effect Transistors. In the first method, more than one sheet of Two Dimensional Electron Gas (2DEG) or high-density electrons with the density of higher than 1e12 $cm^{-2}$ are formed in compound semiconductor devices by implementing multiple layers of materials, which may decrease the ON-state resistance and improve the performance of these devices. This method can be implemented in compound semiconductor resistors, diodes and transistors as will be discussed. Development of substrates having more than one sheet of 2DEG or high-density electrons with the density of higher than 1e12 $cm^{-2}$ will be described which can be used to fabricate devices implementing method-1. In the second method, at least one discontinuity of less than 20 nm is formed in the sheet of 2DEG or high-density electrons path(s) in resistors, transistors and diodes implementing compound semiconductor materials to enhance the device performance. Implementation of method-2 may increase the device maximum current handling capability and reduce its resistance. Furthermore, a method to form an electrical connection between an electrode and a sheet of 2DEG or high density electrons with the density of higher than 1e12 $cm^{-2}$ will be presented which can be implemented in compound semiconductor devices to reduce the contact resistance between an electrode and a sheet of 2DEG or high-density electrons with the density of higher than 1e12 $cm^{-2}$.

DETAILED DESCRIPTION OF THE INVENTION

Figure 1:
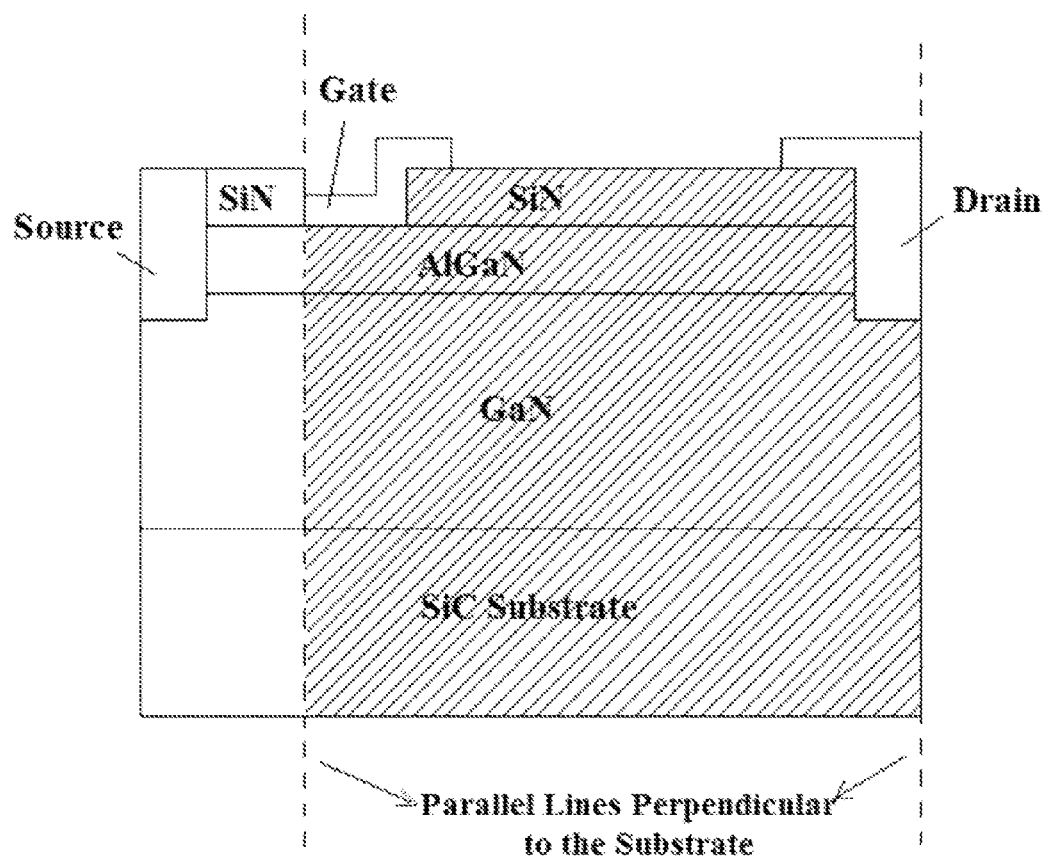
FIG. 1 shows an example where it depicts an entire region between a gate and a drain in an AlGaN/GaN HEMT.

Different examples will be described in details that represent some example embodiments of the presented methods. However the technical and structural descriptions presented herein are representatives for the purposes of describing the presented methods, the described methods may be embodied in many alternate forms and should not be limited to the example embodiments described herein.

The described examples can be modified in various alternative forms. For example, the thicknesses and dimensions of the regions in drawings may be exaggerated for clarity. There is no intention to limit the invention to the particular forms disclosed. However, examples are used to describe the methods and to cover some modifications and alternatives within the scopes of the presented methods.

The spatially relative terms used here such as "underneath", "below" and "above" are for the ease of description and to show the relationship between an element and another one in the figures. If the device in the figure is turned over, for example, elements described as "underneath" or "below" other elements would then be "above" other elements. Therefore, for example, the term "underneath" can represent an orientation which is below as well as above. If the device is rotated, the spatially relative terms used herein should be interpreted accordingly.

Unless otherwise stated, variations of the shapes of the figures as a result of, for example, manufacturing techniques and tolerances are expected. For instance, a doped rectangle region with a specified doping concentration in illustrations may have rounded or curved features or gradient at its edges rather than an abrupt change from a region to another region. Therefore, the regions illustrated in figures are schematic and their shapes do not necessarily show the actual shape of the fabricated device. Unless otherwise stated, there is no intention to limit the presented methods to the values (such as dimensions, bias voltages and doping concentrations) used to describe the example embodiments. These values are selected to describe the related characteristics for a better understanding of the presented methods. Unless otherwise stated, the terms used herein have the same meaning as commonly understood by someone with ordinary skills in the invention field.

Throughout this document, the whole device structure in presented example embodiments may not be shown for the sake of simplicity. This can be understood by someone with ordinary expertise in the field of invention. For example, when presenting an AlGaN/GaN High Electron Mobility Transistor, we may just show the top AlGaN/GaN heterostructure and not the substrate and the intermediate layers to relief the strain or the top passivation layer and heat sink material. In such cases, any new or well-known designs for the un-shown parts are expected. Therefore, it should be understood that the provided example embodiments may just have illustrations and features that are mainly intend to depict the scope of the presented methods and different designs of other parts of the device are expected.

It should be noted that in presented example embodiments, we may just show a cross-sectional view of an entire or a part of a device. In such cases, the said device can either be homogenous in the third dimension where it has a fixed width or it can be non-homogenous in the third dimension. For the case of devices that are non-homogeneous in the third dimension, the illustrated cross-sectional view shows a slice of a part of the device. For example, for the cases of HEMTs operating at high voltages, the source contact may be fabricated as a circle or any other curved shape with the gate and drain contacts surrounding the said source contact. Or, the drain contact may be fabricated as a circle or any other curved shape with the gate and drain contacts surrounding the said drain contact. In other modifications, the source contact may be fabricated as a rectangle or a square, with the gate and drain contacts surrounding the said source contact. Or, the drain contact may be fabricated as a rectangle or a square, with the gate and source contacts surrounding the said drain contact. These are typically understood by someone with ordinary skills in the invention field. Examples will be provided later in this document to shed more light on this matter. Therefore, in example embodiments showing a cross-sectional view of a device, the device may or may not be homogeneous in the third dimension and the depicted cross-sectional view shows a slice of the entire device.

The first method (referred to as method-1 throughout this document) may be implemented to improve the performance of devices implementing compound semiconductors by implementing more than one sheet of 2DEG or high-density electrons with the density of higher than $1e12\ cm^{-2}$ in diodes, transistors and resistors. For implementing method-1 in transistors having at least one heterostructure of compound semiconductor materials, at least two sheets of 2DEG or high-density electrons with the density of higher than $1e12\ cm^{-2}$ are formed in an entire or part of a region between a drain and a gate and/or in an entire or part of a region between a source and a gate by implementing at least two layers of materials. At least two of the said sheets of 2DEG or high-density electrons are connected together in at least two places by electrically floating or biased contacts, wherein at least one of the said contacts is neither the source nor the drain. In the case that the said sheets of 2DEG or high-density electrons are implemented in a region between the gate and the drain, one of the said contacts that connects at least two of the said sheets of 2DEG or high-density electrons may be the said drain contact. By implementing this technique, multiple current passes may be created for the carriers from one contact to another which may decrease the electrical resistance between the said contacts. This may be exceedingly important in Kilo-Volts range HEMTs for example, wherein the gate-to-drain distance is very long to gradually drop the drain bias along the drain region. This long gate-to-drain distance causes the total ON-state resistance ($R_{ON}$) of the device to be increased and there is a trade-off between the breakdown voltage ($V_{BR}$) and $R_{ON}$. Implementing method-1 in these types of HEMTs may significantly decrease the ON-state resistance and improve the device $R_{ON}$-$V_{BR}$ Figure-of-Merit (FOM).

In many places throughout this document, implementations of sheets of 2DEG or high-density electrons with the density of higher than 1e12 cm$^{-2}$ in an entire or part of a region "between" two contacts are mentioned. For example, in the description of method-1, implementation of the said sheets of 2DEG or high-density electrons in an entire or part of a region "between" a drain and a gate and/or in an entire or part of a region "between" a source and a gate is mentioned. Therefore, it is necessary to clarify the exact location of the region "between" two contacts. Considering a cross-sectional view of the device that depicts the said contacts, if two parallel lines with the largest possible mutual spacing are sketched perpendicular to the device substrate in a way such that each line intersects one of the said contacts in at least one point, any region between these parallel lines from the top of the device all the way down to the substrate (excluding the said contacts) is considered as a region "between" the said two contacts. FIG. 1 shows an example where it illustrates an entire region between a gate and a drain in an AlGaN/GaN HEMT. The entire region between the said gate and the said drain is shaded in this figure.

Figure 2:
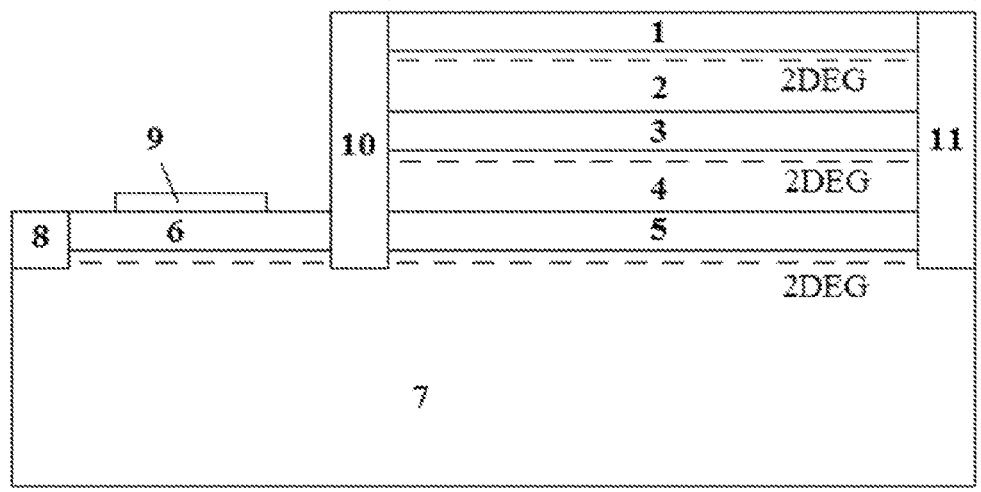
FIG. 2 shows an example embodiment of implementation of method-1 in a HEMT.

FIG. 2 illustrates an example embodiment of implementation of method-1 in a HEMT. In one example embodiment, 1, 3, 5 and 6 are AlGaN, 2, 4 and 7 are GaN, 8 is a source contact, 9 is a gate contact, 10 is an electrically floating contact which is neither a source nor a drain and 11 is a drain contact. In another example embodiment, 1, 3, 5 and 6 are AlGaAs, 2, 4 and 7 are GaAs, 8 is a source contact, 9 is a gate contact, 10 is an electrically floating contact which is neither a source nor a drain and 11 is a drain contact. In another example embodiment, 1, 3, 5 and 6 are AlGaN, 2 and 4 are InGaN, 7 is GaN, 8 is a source contact, 9 is a gate contact, 10 is an electrically floating contact which is neither a source nor a drain and 11 is a drain contact. Here, three sheets of 2DEG are formed in a part of a region between the gate and drain. In other example embodiments, there might be sheets of high-density electrons with the density of higher than 1e12 cm$^{-2}$ instead of any of the sheets of 2DEG shown in FIG. 2.

Figure 3:
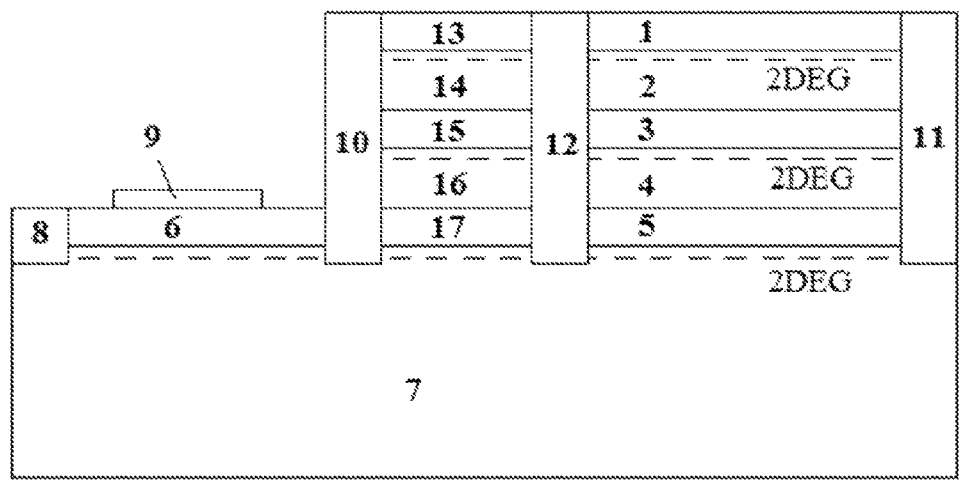
FIG. 3 shows an example embodiment of implementation of method-1 in a HEMT wherein two electrically floating contacts are implemented to short sheets of 2DEG in a region between a gate and a drain.

FIG. 3 shows another example embodiment of implementation of method-1 in a HEMT wherein two electrically floating contacts are implemented to short sheets of 2DEG in a region between a gate and a drain. In one example embodiment, 1, 3, 5, 6, 13, 15 and 17 are AlGaN, 2, 4, 7, 14 and 16 are GaN, 8 is a source contact, 9 is a gate contact, 10 and 12 are electrically floating contacts which are neither a source nor a drain and 11 is a drain contact. In another example embodiment, 1, 3, 5, 6, 13, 15 and 17 are AlGaAs, 2, 4, 7, 14 and 16 are GaAs, 8 is a source contact, 9 is a gate contact, 10 and 12 are electrically floating contacts and 11 is a drain contact.

Figure 4:
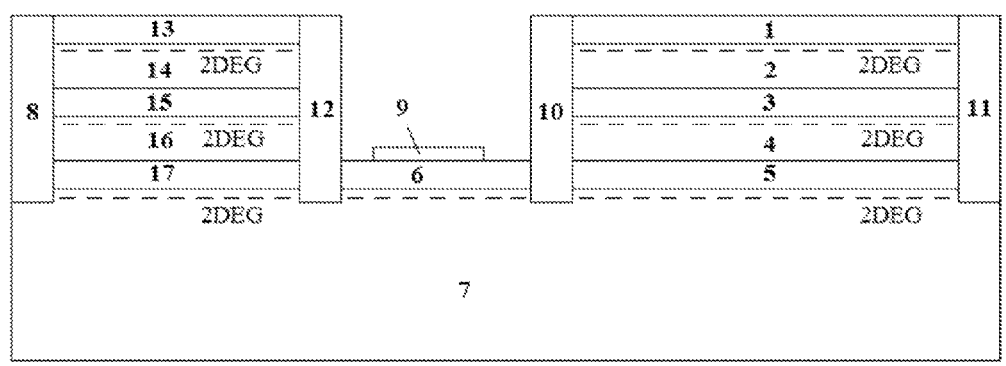
FIG. 4 illustrates an example embodiment of implementation of method-1 in a HEMT in which sheets of 2DEG are implemented in a region between a gate and a drain and in a region between the said gate and a source.

FIG. 4 illustrates an example embodiment of implementation of method-1 in a HEMT in which sheets of 2DEG are implemented in a region between a gate and a drain and also in a region between a source and the gate. In one example embodiment, 1, 3, 5, 6, 13, 15 and 17 are AlGaN, 2, 4, 7, 14 and 16 are GaN, 8 is a source contact, 9 is a gate contact, 10 and 12 are electrically floating contacts which are neither a source nor a drain and 11 is a drain contact. In another example embodiment, 1, 3, 5, 6, 13, 15 and 17 are AlGaAs, 2, 4, 7, 14 and 16 are GaAs, 8 is a source contact, 9 is a gate contact, 10 and 12 are electrically floating contacts and 11 is a drain contact.

Figure 5:
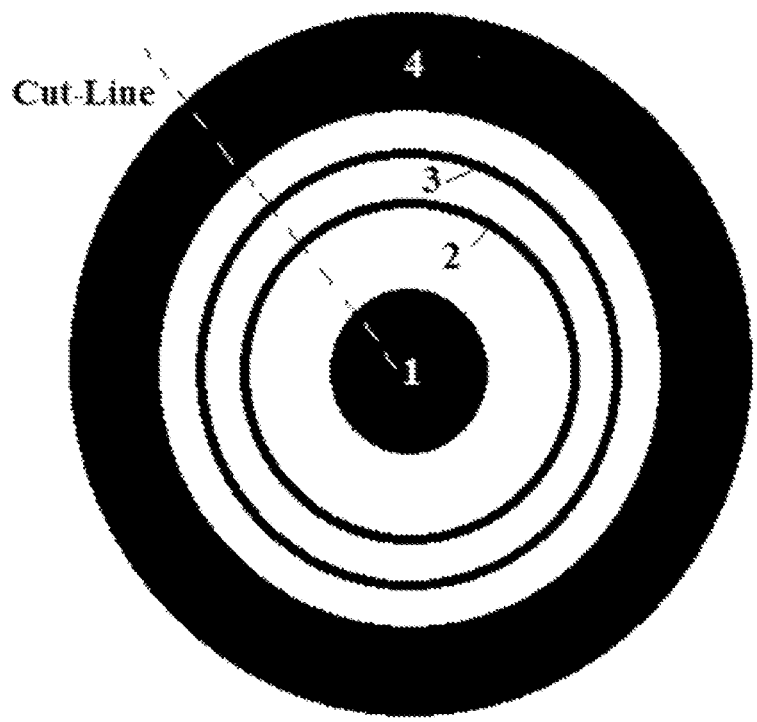
FIG. 5 shows an example embodiment of a top view of the structure shown in FIG. 2 wherein the drain contact is at the center and other contacts are surrounding the drain contact.
Figure 6:
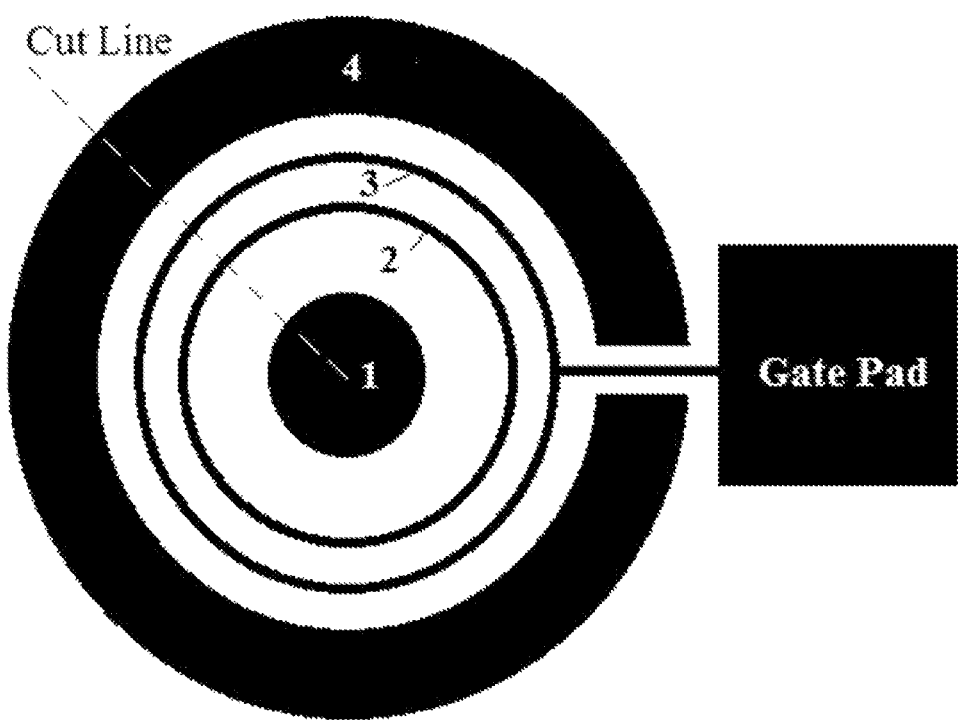
FIG. 6 shows an example embodiment of a top view of the structure shown in FIG. 2 wherein the drain contact is at the center and a contact pad is attached to the gate.

It should be emphasized that in the structures shown in FIGS. 2 through 4, field plates may be implemented for any of the contacts, any well-known or new substrate may be used, any of the depicted semiconductor layers may be doped or un-doped and a passivation layer may be implemented. Also, as mentioned earlier, these devices may be homogeneous in the third dimension or they can be non-homogenous. For example, they can be fabricated in a way such that one contact is at the center and other contacts are surrounding the said contact at the center. FIG. 5 shows an example embodiment of a top view of the structure shown in FIG. 2 wherein the drain contact is at the center and other contacts are surrounding the drain contact. Here, 1 is the drain contact, 2 is the electrically floating contact, 3 is the gate contact and 4 is the source contact. In this case, FIG. 2 shows the cross-sectional view of the structure of FIG. 5 along the shown cut-line. In another example embodiment, the source contact is at the center with the other contacts surrounding the source contact. In other example embodiments, the contact which is at the center has an elliptical shape or it can be a polygon or a square. FIG. 6 shows another example embodiment of a top view of the structure shown in FIG. 2 wherein the drain contact is at the center and other contacts are surrounding the drain contact and a contact pad is attached to the gate. Here, 1 is the drain contact, 2 is the electrically floating contact, 3 is the gate and 4 is the source contact. As illustrated in this figure, a pad is attached to the gate and the source contact is not completely surrounding the drain contact.

Method-1 can also be implemented to fabricate resistors having at least one heterostructure of compound semiconductor materials. In this case, at least two sheets of 2DEG or high-density electrons with the density of higher than 1e12 cm$^{-2}$ are formed in an entire or part of a region between two Ohmic contacts by implementing at least two layers of materials. At least two of the said sheets of 2DEG or high-density electrons are connected together in at least two places by electrically floating or biased contacts.

Figure 7:
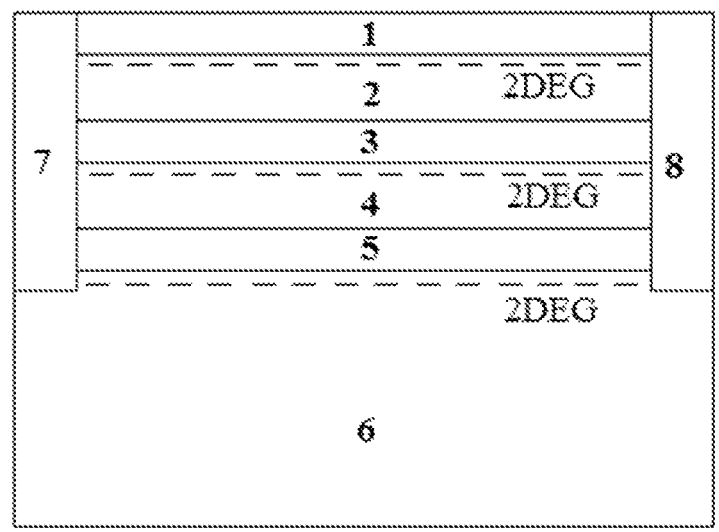
FIG. 7 shows a resistor with at least one heterostructure of compound semiconductor materials implementing method-1.

FIG. 7 shows an example embodiment of implementation of method-1 to fabricate a resistor. In one example embodiment, 1, 3 and 5 are AlGaN, 2, 4 and 6 are GaN and 7 and 8 are Ohmic contacts. In another example embodiment, 1, 3 and 5 are AlGaAs, 2, 4 and 6 are GaAs and 7 and 8 are Ohmic contacts. One contact may be fabricated as a circle and another contact as a donut surrounding the said circular contact. Any of the said contacts may have field plates and be made of any materials or combination of materials.

Figure 8:
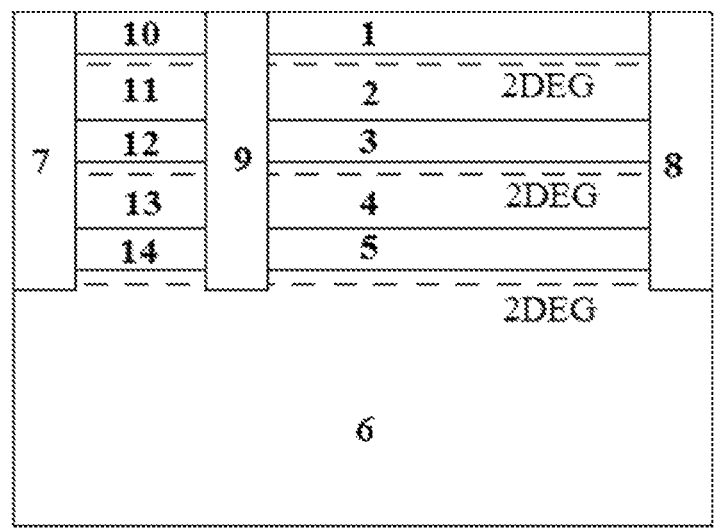
FIG. 8 shows an example embodiment of implementation of method-1 in a resistor wherein an electrically floating contact is used to connect sheets of 2DEG between two Ohmic contacts.

FIG. 8 shows another example embodiment of implementation of method-1 in a resistor wherein an electrically floating contact is used to connect the sheets of 2DEG between two Ohmic contacts. In one example embodiment, 1, 3, 5, 10, 12 and 14 are AlGaN, 2, 4, 6, 11 and 13 are GaN, 7 and 8 are Ohmic contacts and 9 is an electrically floating contact. In another example embodiment, 1, 3, 5, 10, 12 and 14 are AlGaN, 2, 4, 11 and 13 are InGaN, 6 is GaN, 7 and 8 are Ohmic contacts and 9 is an electrically floating contact.

Figure 9:
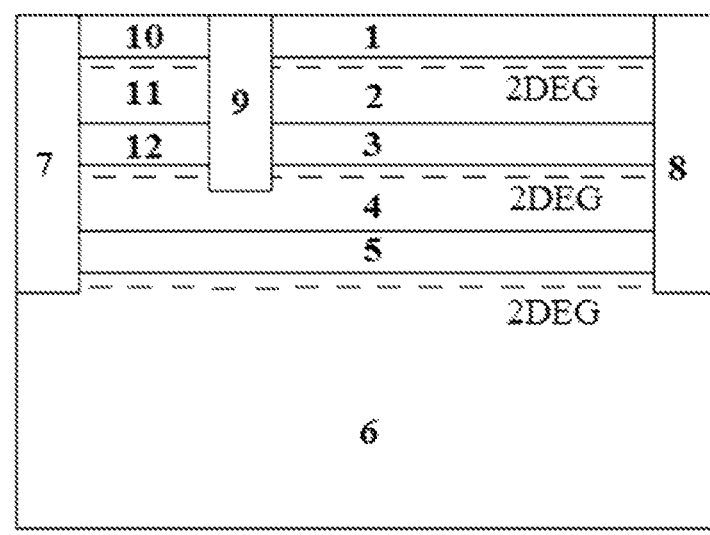
FIG. 9 shows an example embodiment of implementation of method-1 in a resistor wherein an electrically floating contact is used to connect just two sheets of 2DEG while other contacts are connecting all the sheets of 2DEG together.

FIG. 9 shows an example embodiment of implementation of method-1 in a resistor wherein an electrically floating contact is used to connect just two sheets of 2DEG while other contacts are connecting all sheets of 2DEG together. In one example embodiment, 1, 3, 5, 10 and 12 are n-doped or intrinsic AlGaN, 2, 4, 6 and 11 are GaN, 7 and 8 are Ohmic contacts and 9 is an electrically floating contact. In another example embodiment, 1, 3, 5, 10 and 12 are AlGaN, 2, 4 and 11 are InGaN, 6 is GaN, 7 and 8 are Ohmic contacts and 9 is an electrically floating contact.

Figure 10:
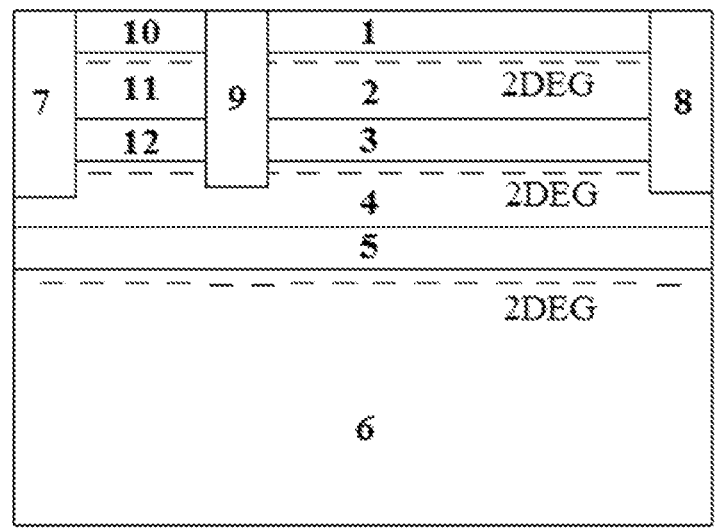
FIG. 10 shows an example embodiment of implementation of method-1 in a resistor wherein all contacts are connecting just two sheets of 2DEG together at different places.

FIG. 10 shows an example embodiment of implementation of method-1 in a resistor wherein all contacts are connecting just two sheets of 2DEG together at different places. In one example embodiment, 1, 3, 5, 10 and 12 are n-doped or intrinsic AlGaN, 2, 4, 6 and 11 are GaN, 7 and 8 are Ohmic contacts and 9 is an electrically floating contact. In another example embodiment, 1, 3, 5, 10 and 12 are AlGaN, 2, 4 and 11 are InGaN, 6 is GaN, 7 and 8 are Ohmic contacts and 9 is an electrically floating contact.

Figure 11:
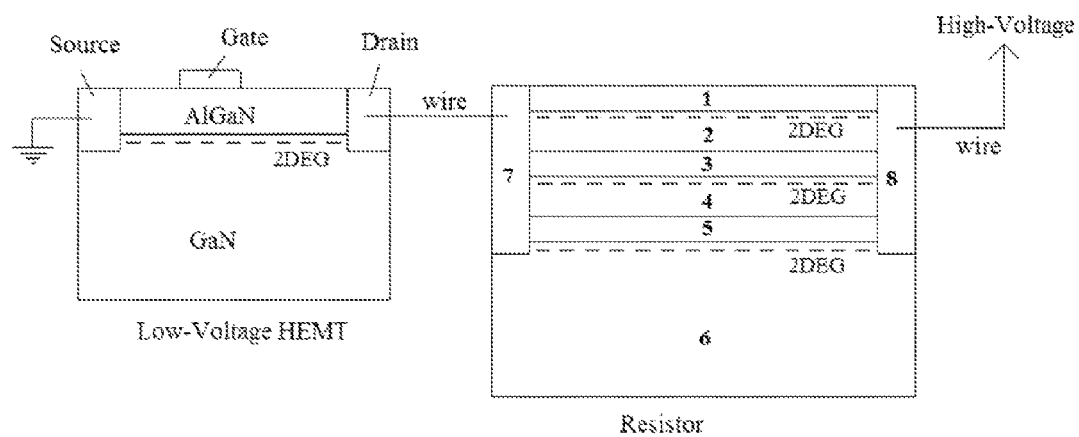
FIG. 11 shows an example in which a resistor made by implementation of method-1 is connected in series with an AlGaN/GaN HEMT.

The resistors made by the implementation of method-1 may be connected in series with other electronic devices such as diodes or transistors. In an example embodiment (FIG. 11), the drain of an AlGaN/GaN HEMT is connected to one terminal of the said resistor, a high-voltage node is connected to the other terminal of the resistor and a lower voltage node or ground is connected to the source of the said HEMT. Here, 1, 3 and 5 are AlGaN, 2, 4 and 6 are GaN and 7 and 8 are Ohmic contacts. Therefore, by implementing this technique lower voltage devices (like the HEMT of this example) may be connected to higher voltage nodes without device breakdown.

Figure 12:
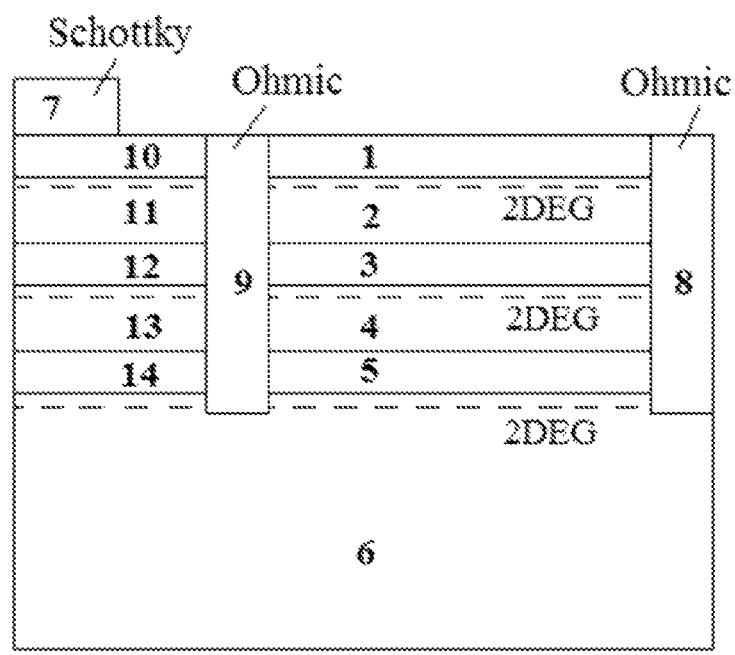
FIG. 12 shows an example embodiment of implementation of method-1 to fabricate a diode with one floating Ohmic contact.

Method-1 can also be implemented to fabricate diodes having at least one heterostructure of compound semiconductor materials. In this case, at least two sheets of 2DEG or high-density electrons with the density of higher than 1e12 $cm^{-2}$ are formed in an entire or part of a region between an Ohmic and a Schottky contact by implementing at least two layers of materials. At least two of the said sheets of 2DEG or high-density electrons are connected together in at least two places by electrically floating or biased contacts. FIG. 12 shows an example embodiment. 1, 3, 5, 10, 12 and 14 are AlGaN, 2, 4, 6, 11 and 13 are GaN, 8 and 9 are Ohmic contacts and 7 is a Schottky contact. Here, contact 9 is electrically floating.

Figure 13:
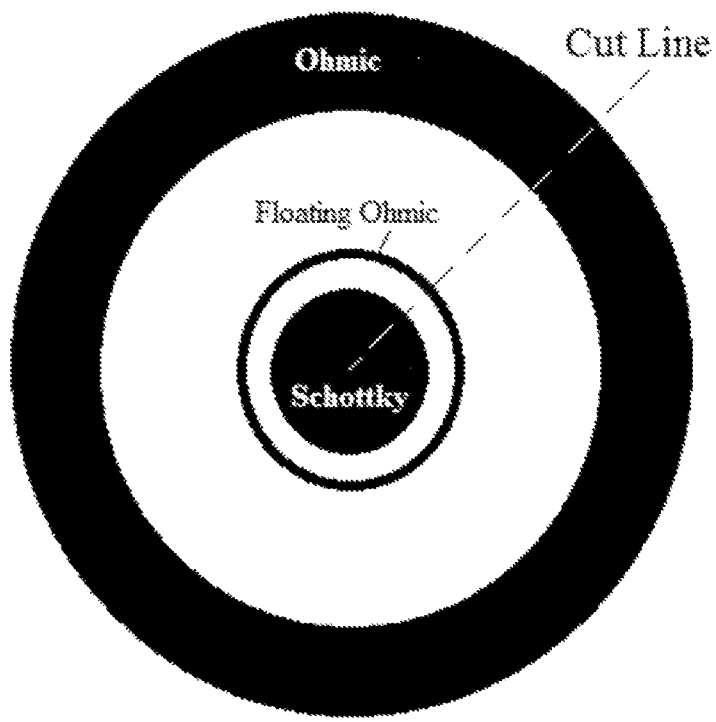
FIG. 13 shows an example of a top view of the structure shown in FIG. 12 wherein the Schottky contact is at the center and the other two Ohmic contacts are surrounding the said Schottky contact.

FIG. 13 shows an example embodiment of a top view of the structure shown in FIG. 12. Here, the inner circular contact in FIG. 13 is a top view of the Schottky contact 7 of FIG. 12, the electrically floating Ohmic contact ring in FIG. 13 is a top view of the contact 9 of FIG. 12 and the outer ring contact in FIG. 13 is a top view of the contact 8 of FIG. 12. The cross-sectional view of the device along the cut line shown in FIG. 13 is same as the one shown in FIG. 12. In other example embodiments, the inner circular contact and outer rings contacts may not be co-centered. In other example embodiments, the inner contact may have elliptical or polygonal shapes with outer contacts surrounding the said inner contact.

Figure 14:
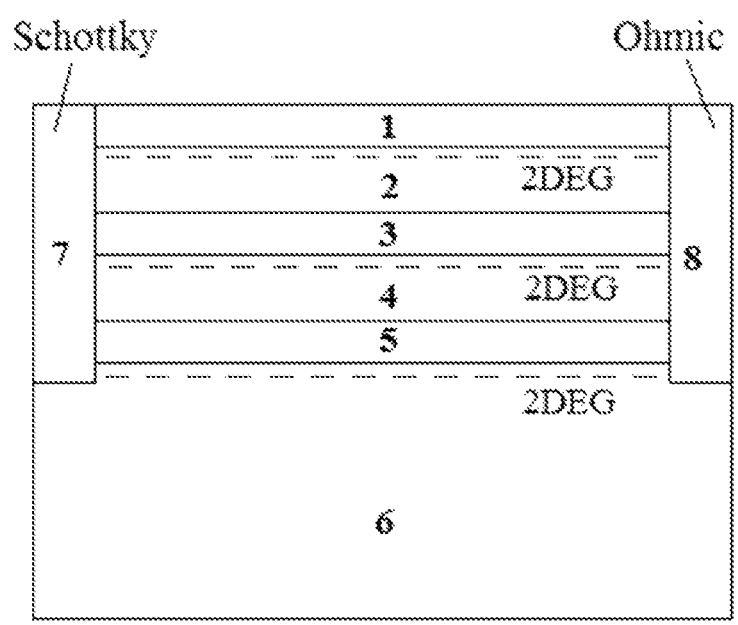
FIG. 14 shows an example embodiment of implementation of method-1 to fabricate a diode with an Ohmic and a Schottky contact.

FIG. 14 shows another example embodiment of implementation of method-1 to fabricate a diode. In one example embodiment, 1, 3 and 5 are AlGaN, 2, 4 and 6 are GaN, 7 is a Schottky contact and 8 is an Ohmic contact. In another example embodiment, 1, 3 and 5 are AlGaAs, 2, 4 and 6 are GaAs, 7 is a Schottky contact and 8 is an Ohmic contact.

Figure 15:
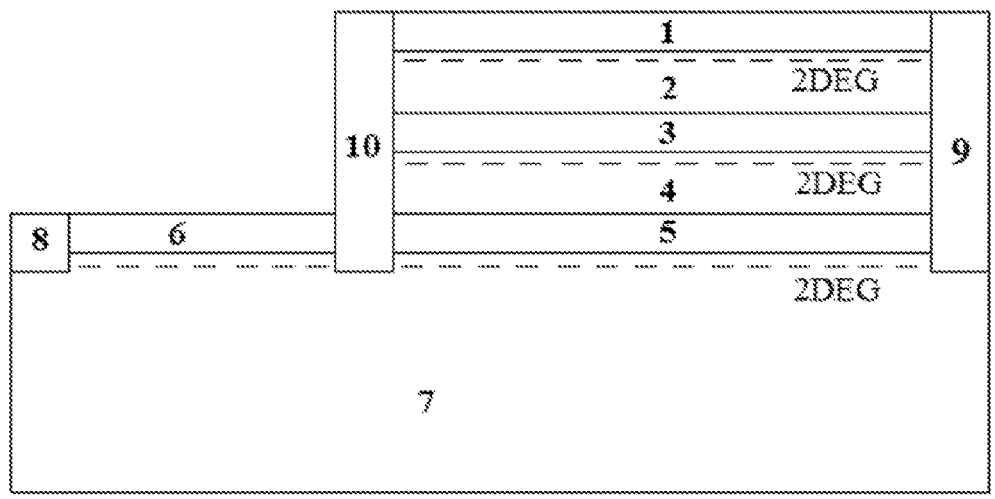
FIG. 15 shows an example embodiment of implementation of method-1 to fabricate a diode.

FIG. 15 shows an example embodiment of implementation of method-1 to fabricate a diode. 1, 3, 5 and 6 are n-doped AlGaN, 2, 4 and 7 are GaN and 10 is an electrically floating Ohmic contact. In one example embodiment, 8 is an Ohmic contact and 9 is a Schottky contact and in another example embodiment, 8 is a Schottky contact and 9 is an Ohmic contact.

Figure 16:
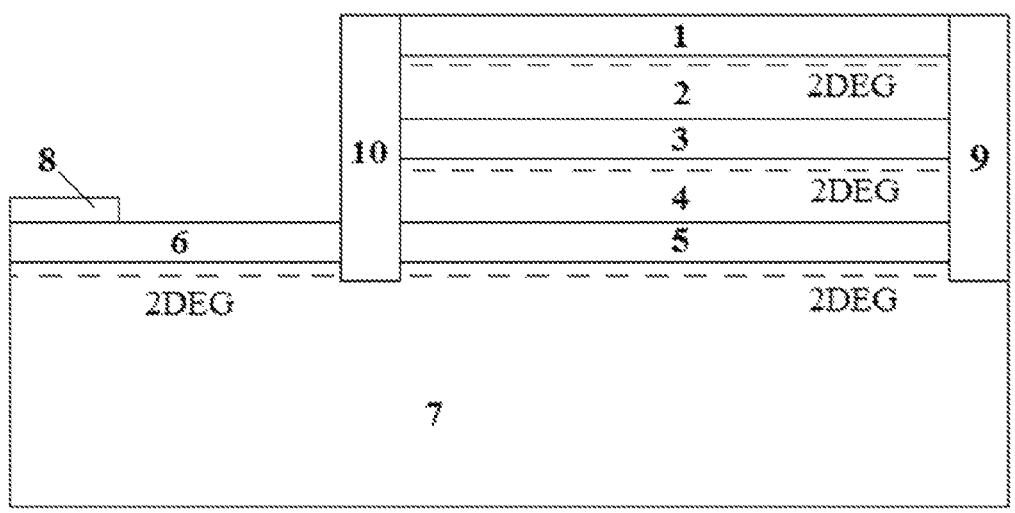
FIG. 16 shows an example embodiment of implementation of method-1 to fabricate a diode.

FIG. 16 shows another example embodiment of implementation of method-1 to fabricate a diode. 1, 3, 5 and 6 are n-doped AlGaN, 2, 4 and 7 are GaN, 10 is an electrically floating Ohmic contact, 8 is a Schottky contact and 9 is an Ohmic contact.

The second method (referred to as method-2 throughout this document) may be used to improve the performance of devices implementing compound semiconductors by implementing at least one discontinuity of less than 20 nm in the sheet(s) of 2DEG or high-density electrons in semiconductor devices such as diodes, transistors and resistors. Method-2 can be implemented in transistors having at least one heterostructure of compound semiconductor materials. In this case, at least one sheet of 2DEG or high-density electrons with the density of higher than 1e12 $cm^{-2}$ is formed in an entire or part of a region between a drain and a gate and/or in an entire or part of a region between a source and a gate by implementing at least two layers of materials. At least one discontinuity of less than 20 nm is provided in at least one of the said sheet(s) of 2DEG or high-density electrons by implementing at least one material. The implemented material or materials may or may not provide a tunneling barrier in the said sheet(s) of 2DEG or high-density electrons.

Figure 17:
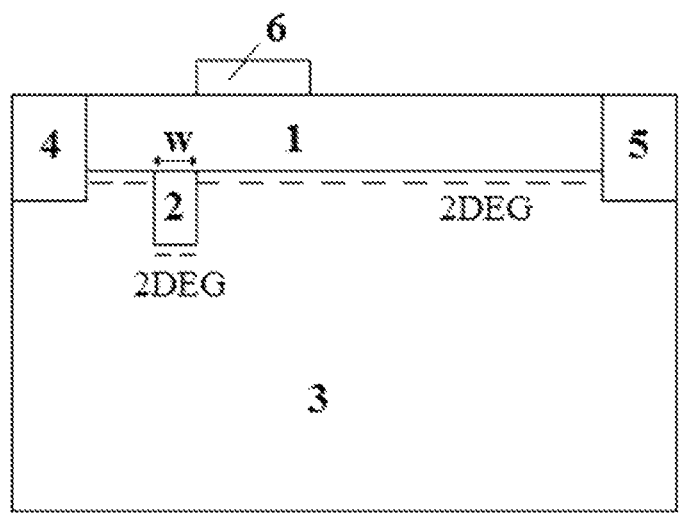
FIG. 17 shows an example embodiment of implementation of method-2 in an AlGaN/GaN HEMT wherein one tunneling barrier is formed in a sheet of 2DEG pass from a source to a drain near the left edge of a gate.

FIG. 17 shows an example embodiment of implementation of method-2 in an AlGaN/GaN HEMT wherein one tunneling barrier is formed in a sheet of 2DEG path from a source to a drain near the left edge of a gate. Here, 1 and 2 are AlGaN, 3 is GaN, 4 is a source contact, 5 is a drain contact and 6 is a gate contact. The aluminum mole fraction and the doping profile of the AlGaN of region 2 can be same as or different from those of region 1. As illustrated in FIG. 17, implementation of 2 provides a discontinuity in the sheet of 2DEG pass from the source to the drain. The length of this discontinuity, w, is less than 20 nm. In this case, the electrons of the sheet of 2DEG at the left side of the region 2 may tunnel across 2 into the channel underneath the gate which may increase the turn ON speed and decrease the ON-state resistance of the device. In some example embodiments, region 2 may be replaced with different material layers or combinations of different materials.

Figure 18:
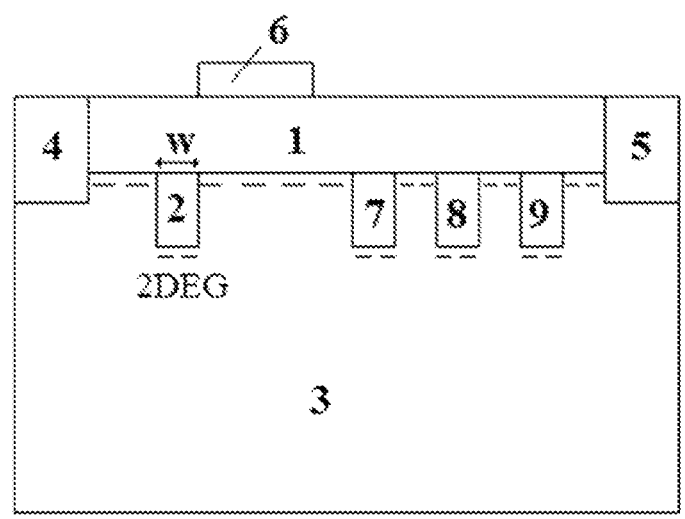
FIG. 18 shows an example embodiment of implementation of method-2 in an AlGaN/GaN HEMT wherein multiple discontinuities are implemented in a sheet of 2DEG pass from a source to a drain.

FIG. 18 shows another example embodiment of implementation of method-2 in an AlGaN/GaN HEMT wherein multiple discontinuities are implemented in a sheet of 2DEG path from a source to a drain. 1, 2, 7, 8 and 9 are AlGaN, 3 is GaN, 4 is a source contact, 5 is a drain contact and 6 is a gate contact. Any aluminum mole fraction and doping profile are expected for any of the AlGaN regions. In other example embodiments, any of the regions 2, 7, 8 or 9 can be AlN or InGaN or they can be made of multiple layers of other materials.

Method-2 can also be implemented in resistors having at least one heterostructure of compound semiconductor materials. In this case, at least one sheet of 2DEG or high-density electrons with the density of higher than 1e12 $cm^{-2}$ is formed in an entire or part of a region between two Ohmic contacts by implementing at least two layers of materials. At least one discontinuity of less than 20 nm is provided in at least one of the said sheet(s) of 2DEG or high-density electrons by implementing at least one material. The implemented material or materials may or may not provide a tunneling barrier in the said sheet(s) of 2DEG or high-density electrons.

Figure 19:
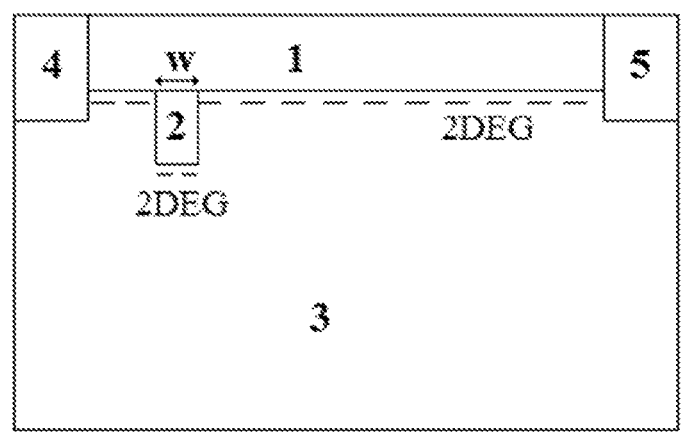
FIG. 19 shows an example embodiment of implementation of method-2 in an AlGaN/GaN resistor.

FIG. 19 shows an example embodiment of implementation of method-2 in an AlGaN/GaN resistor. 1 and 2 are AlGaN, 3 is GaN and 4 and 5 are Ohmic contacts. The aluminum mole fraction and the doping profile of the AlGaN of region 2 can be same as or different from those of region 1. In another example embodiment, 1 and 2 are AlGaAs, 3 is GaAs and 4 and 5 are Ohmic contacts.

Figure 20:
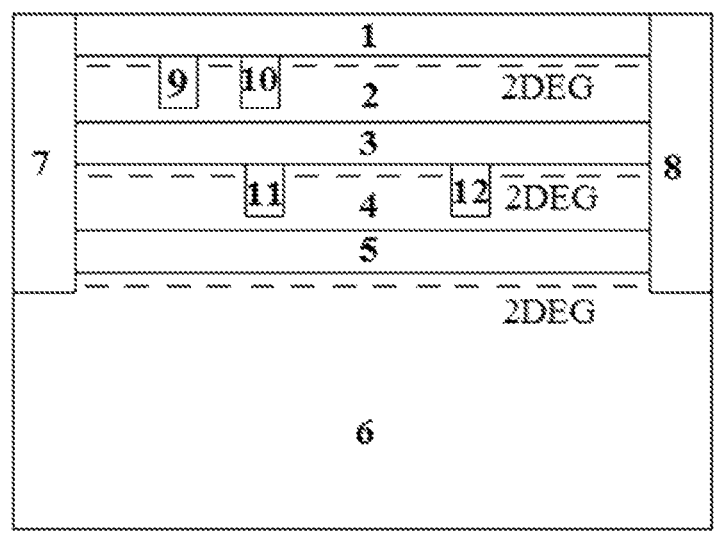
FIG. 20 shows an example embodiment of implementation of method-2 in a resistor with multiple sheets of 2DEG.

FIG. 20 shows another example embodiment of implementation of method-2 in a resistor with multiple sheets of 2DEG. 1, 3, 5, 9, 10, 11 and 12 are AlGaN, 2, 4 and 6 are GaN and 7 and 8 are Ohmic contacts. As shown in this figure, implementation of 9, 10, 11 and 12 provide discontinuities in the sheets of 2DEG.

In addition to resistors and transistors, method-2 can also be implemented in diodes having at least one heterostructure of compound semiconductor materials. In this case, at least one sheet of 2DEG or high-density electrons with the density of higher than 1e12 $cm^{-2}$ is formed in an entire or part of a region between an Ohmic and a Schottky contact by implementing at least two layers of materials. At least one discontinuity of less than 20 nm is provided in at least one of the said sheet(s) of 2DEG or high-density electrons by implementing at least one material. The implemented material or materials may or may not provide a tunneling barrier in the sheet of 2DEG or high-density electrons. An example embodiment can be the structure shown in FIG. 19 wherein 1 and 2 are AlGaN, 3 is GaN, 4 is a Schottky contact and 5 is an Ohmic contact. Another example embodiment can be the structure shown in FIG. 20 wherein 1, 3, 5, 9, 10, 11 and 12 are AlGaN, 2, 4 and 6 are GaN, 7 is an Ohmic contact and 8 is a Schottky contact.

Figure 21:
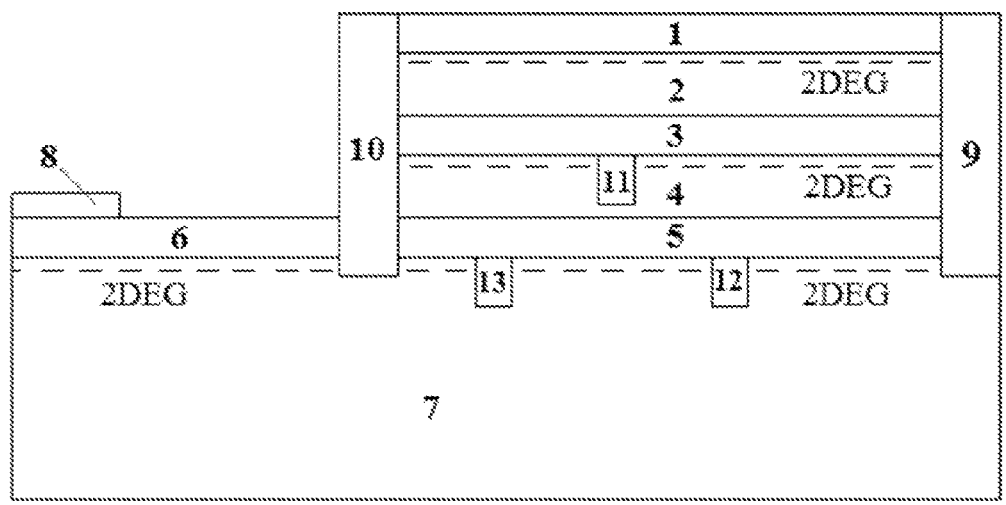
FIG. 21 shows an example embodiment of implementation of method-2 in a Schottky diode having an electrically floating Ohmic contact.

FIG. 21 shows an example embodiment of implementation of method-2 in a Schottky diode having an electrically floating Ohmic contact. 1, 3, 5, 6, 11, 12 and 13 are AlGaN, 2, 4 and 7 are GaN, 8 is a Schottky contact, 9 is an Ohmic contact and 10 is an electrically floating Ohmic contact. Implementation of 11, 12 and 13 provide discontinuities in the sheets of 2DEG.

Figure 22:
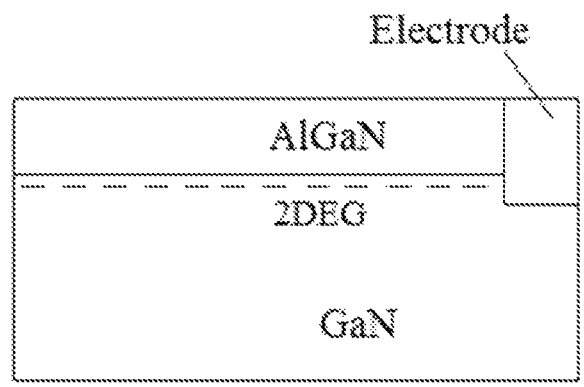
FIG. 22 shows a conventional way of forming an electrical connection between an electrode and a sheet of 2DEG at an AlGaN/GaN interface.

Several methods are conventionally used to form an electrical connection between an electrode and a sheet of 2DEG. For example, in an AlGaN/GaN heterostructure, in order to form an Ohmic contact to the sheet of 2DEG at the AlGaN/GaN interface, Ti/Al/Ni/Au metal stack is evaporated on top of the AlGaN layer. Annealing causes the Ti to diffuse into the said heterostructure which forms TiN that makes an Ohmic contact to the said sheet of 2DEG. In this case, a plane can be drawn tangent to the said sheet of 2DEG wherein the said plane intersects the metal electrode, FIG. 22 shows an example embodiment. As another example, in order to form a Schottky contact to a sheet of 2DEG at an AlGaN/GaN interface, the said heterostructure may be etched using a dry-etching method and then a metal stack is deposited and patterned, wherein the said metal stack fills up the etched region. Also in this case, a plane can be drawn tangent to the said sheet of 2DEG, wherein the said plane intersects the metal electrode.

Figure 23:
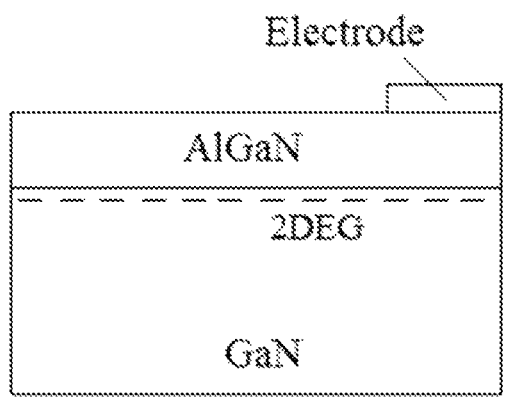
FIG. 23 illustrates a conventional way of forming an electrical connection between an electrode and a sheet of 2DEG at an AlGaN/GaN interface wherein the said electrode is on top of the AlGaN layer and it forms a Schottky contact to AlGaN.
Figure 24:
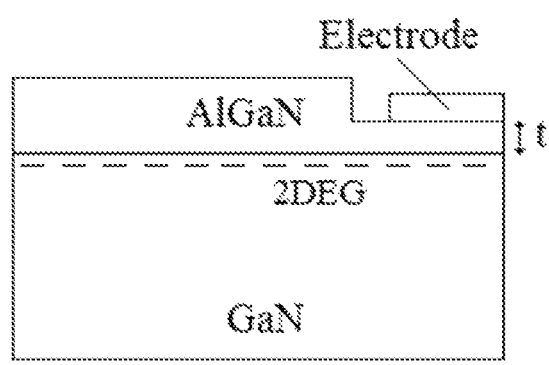
FIG. 24 shows a conventional way of forming an electrical connection between an electrode and a sheet of 2DEG at an AlGaN/GaN interface wherein the said electrode is on top of the AlGaN layer and it forms a Schottky contact to AlGaN. The AlGaN layer underneath the electrode is partially etched.

Another conventional way of forming an electrical connection between an electrode and a sheet of 2DEG at an AlGaN/GaN interface (for example) is depositing an electrode metal stack on top of the AlGaN layer where the said electrode forms a Schottky contact to the AlGaN (FIG. 23 shows an example embodiment). When the electrode is positively-biased relative to the said sheet of 2DEG, the electrons in the valence band of GaN may be injected toward the metal electrode, which is equivalent to the hole injection from the metal electrode into the GaN as described in "Li, B. K., et al., Electroluminescence from a forward biased Ni/Au—AlGaN/GaN Schottky diode: evidence of Fermi level de-pinning at Ni/AlGaN interface. Physica Status Solidi (c), 2010. 7(7-8): p. 1961-1963.". If the AlGaN layer is partially etched (as shown in FIG. 24) with the Schottky contact is deposited on top of the AlGaN layer, in the case that the thickness of AlGaN layer underneath the electrode (t) is small enough, electrons in conduction band may tunnel through the AlGaN and contribute to the total current, a process that may increase the total current and reduce the resistance between the electrode and the said sheet of 2DEG. At the same time, reduction of the thickness of AlGaN reduces the 2DEG density at AlGaN/GaN interface underneath the electrode which is not desirable. Implementation of the third method of this invention (as will be described) may resolve this issue by providing a tunneling current at the conduction band while keeping the 2DEG density relatively high.

The third method (referred to as method-3 throughout this document) may be used to form an electrical connection between an electrode and a sheet of 2DEG or high-density electrons with the density of higher than 1e12 $cm^{-2}$. In this method, a semiconductor material is placed in between an electrode and a sheet of 2DEG or high-density electrons with the density of higher than 1e12 $cm^{-2}$. In this case, a plane can be drawn tangent to the said sheet of 2DEG or high-density electrons wherein the said plane intersects the said electrode. The minimum distance between the said electrode and the said sheet of 2DEG or high-density electrons is less than 20 nm. The said electrode may or may not form a Schottky contact to the said semiconductor material placed in between the said electrode and the said sheet of 2DEG or high-density electrons. The said electrode can be made of any material or combination of materials. For example Ni/Au metal stack may be implemented as the electrode to form an electrical connection to a sheet of 2DEG at an AlGaN/GaN interface.

Figure 25:
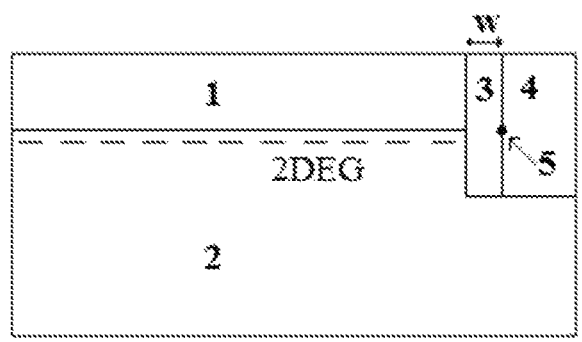
FIG. 25 shows an example embodiment of implementation of method-3 to form an electrical connection between an electrode and a sheet of 2DEG at an AlGaN/GaN interface.

FIG. 25 shows an example embodiment of implementation of method-3 to form an electrical connection between an electrode and a sheet of 2DEG at an AlGaN/GaN interface. Here, 1 and 3 are AlGaN, 2 is GaN and 4 is an electrode. The electrode makes a Schottky contact to 3. Each of the semiconductor regions in this figure may be doped or intrinsic. The aluminum mole fraction and doping profile of region 1 might be different from those of region 3. A plane can be drawn tangent to the said sheet of 2DEG in a way such that the said plane intersects the said electrode in a line normal to the page passing through point 5. Since the minimum distance between the electrode 4 and the said sheet of 2DEG is w in this example embodiment, w should be smaller than 20 nm. If appropriate aluminum mole fraction and doping profile are selected for region 3, when electrode 4 is positively biased relative to the said sheet of 2DEG, electrons in the conduction band of the sheet of 2DEG at the right side may tunnel across region 3 and go to electrode 4.

Figure 26:
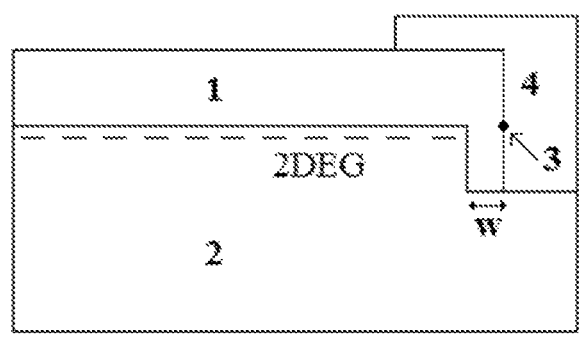
FIG. 26 shows an example embodiment of the implementation of method-3 to form an electrical connection between an electrode and a sheet of 2DEG at an AlGaN/GaN interface.

FIG. 26 shows another example embodiment of implementation of method-3 to form an electrical connection between an electrode and a sheet of 2DEG at an AlGaN/GaN interface. Here, 1 is AlGaN, 2 is GaN and 4 is an electrode. A plane can be drawn tangent to the said sheet of 2DEG wherein the said plane intersects the said electrode in a line normal to the page passing through point 3. As illustrated in this figure, the AlGaN layer 1 is extended into the GaN 2, separating the electrode 4 from the sheet of 2DEG. The width of the extended AlGaN layer, w, must be less than 20 nm.

Figure 27:
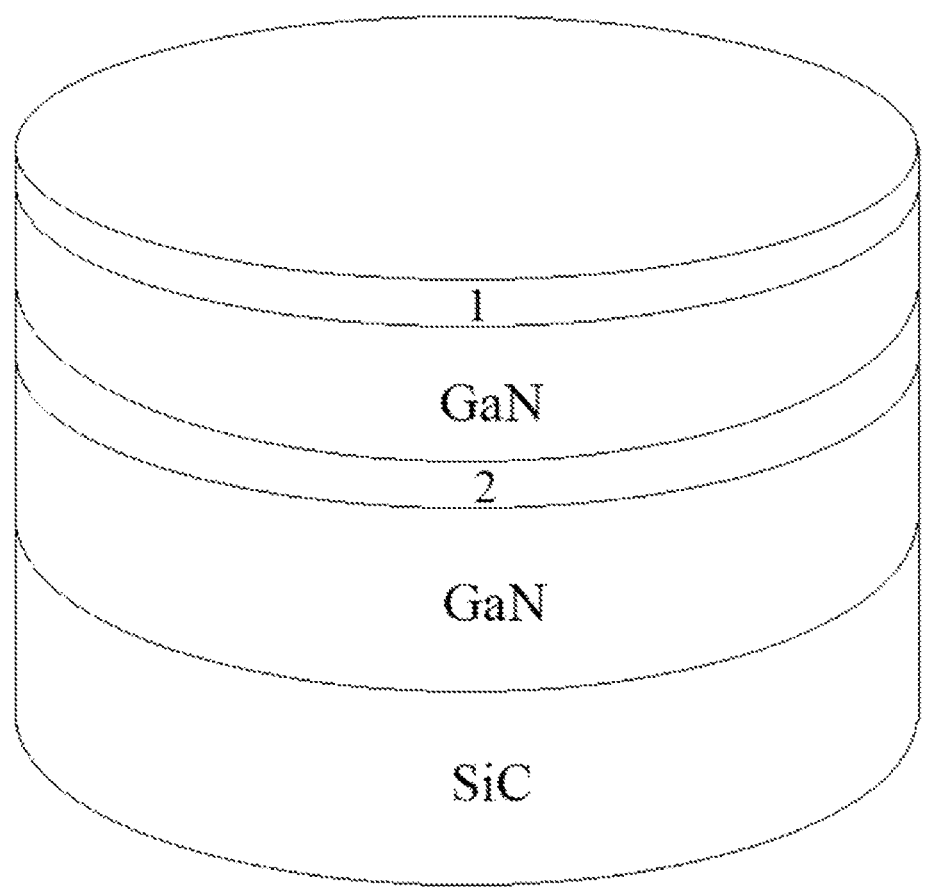
FIG. 27 shows an example embodiment wherein a SiC wafer is used as a substrate to form two sheets of 2DEG.

Wafers with an area of at least 1 $cm^2$ having at least two sheets of 2DEG or high-density electrons with the density of higher than 1e12 $cm^{-2}$ may be produced which may be used to fabricate devices implementing method-1. For this purpose, any well-known or new substrate design may be implemented to form at least two sheets of 2DEG or high-density electrons with the density of higher than 1e12 $cm^{-2}$ by implementing at least two layers of materials. FIG. 27 shows an example embodiment wherein a SiC wafer is used as a substrate. Here, 1 and 2 are n-type AlGaN. In another example embodiment, Si (111) wafer may be used as a substrate with an AlN layer directly grown on top of that the said Si(111) wafer. Then, graded AlGaN layers with Al mole fraction decreasing from the bottom AlGaN layer to the top AlGaN layer are grown on top of said AlN layer, followed by the growth of a first GaN layer on the top AlGaN layer. n-AlGaN/GaN/n-AlGaN layers are then grown on top of the first GaN layer. Any well-known or new substrate may be implemented to form the said sheets of 2DEG or high-density electrons and various compound semiconductor materials may be implemented.

The invention claimed is:

1. A transistor, wherein at least two sheets of 2DEG or high-density electrons with the density of higher than 1e12 $cm^{-2}$ are formed in an entire or part of a region between a drain and a gate and/or in an entire or part of a region between a source and a gate by implementing at least two layers of materials; wherein at least two of the said sheets of 2DEG or high-density electrons are connected together in at least two places by electrically floating or biased contacts; wherein at least one of the said contacts is neither the source nor the drain.

2. The transistor of claim 1, wherein the said sheets of 2DEG or high-density electrons are implemented in the entire or a part of the region between the drain and gate; wherein at least two of the said sheets of 2DEG or high-density electrons are connected together by a drain contact at one side and by an electrically floating contact somewhere between the gate and the said drain contact.

3. The transistor of claim 1, wherein at least one discontinuity of less than 20 nm is provided in at least one of the said sheets of 2DEG or high-density electrons by implementing at least one material.

4. A resistor; wherein at least two sheets of 2DEG or high-density electrons with the density of higher than 1e12 $cm^{-2}$ are formed in an entire or part of a region between two Ohmic contacts by implementing at least two layers of materials; wherein at least two of the said sheets of 2DEG or high-density electrons are connected together in at least two places by electrically floating or biased contacts.

5. The resistor of claim 4, wherein at least two of the said sheets of 2DEG or high-density electrons are connected together at two places by the said Ohmic contacts.

6. The resistor of claim 5 connected in series with another semiconductor device.

7. The resistor of claim 4 connected in series with another semiconductor device.

8. The resistor of claim 4, wherein at least one discontinuity of less than 20 nm is provided in at least one of the said sheets of 2DEG or high-density electrons by implementing at least one material.

9. A diode; wherein at least two sheets of 2DEG or high-density electrons with the density of higher than 1e12 $cm^{-2}$ are formed in an entire or part of a region between an Ohmic and a Schottky contact by implementing at least two layers of materials; wherein at least two of the said sheets of 2DEG or high-density electrons are connected together in at least two places by electrically floating or biased contacts.

10. The diode of claim 9, wherein at least two of the said sheets of 2DEG or high-density electrons are connected together by the said Ohmic and Schottky contacts.

11. The diode of claim 9, wherein at least one discontinuity of less than 20 nm is provided in at least one of the said sheets of 2DEG or high-density electrons by implementing at least one material.

12. A semiconductor device having at least one heterostructure of compound semiconductor materials, wherein at least one sheet of 2DEG or high-density electrons with the density of higher than 1e12 $cm^{-2}$ is formed in an entire or part of a region between at least two contacts by implementing at least two layers of materials; wherein at least one discontinuity of less than 20 nm is provided in at least one of the said sheets of 2DEG or high-density electrons by implementing at least one material.

13. The semiconductor device of claim 12, wherein the said device is a transistor, wherein at least one sheet of 2DEG or high-density electrons with the density of higher than 1e12 $cm^{-2}$ is formed in an entire of or part of a region between a drain and a gate and/or in an entire or part of a region between a source and a gate by implementing at least two layers of materials; wherein at least one discontinuity of less than 20 nm is provided in at least one of the said sheets of 2DEG or high-density electrons by implementing at least one material.

14. The semiconductor device of claim 12, wherein the said device is a diode, wherein at least one sheet of 2DEG or high-density electrons with the density of higher than 1e12 $cm^{-2}$ is formed in an entire of or part of a region between an Ohmic and a Schottky contact by implementing at least two layers of materials; wherein at least one discontinuity of less than 20 nm is provided in at least one of the said sheets of 2DEG or high-density electrons by implementing at least one material.

15. The semiconductor device of claim 12, wherein the said device is a resistor, wherein at least one sheet of 2DEG or high-density electrons with the density of higher than 1e12 $cm^{-2}$ is formed in an entire or part of a region between two Ohmic contacts by implementing at least two layers of materials; wherein at least one discontinuity of less than 20 nm is provided in at least one of the said sheets of 2DEG or high-density electrons by implementing at least one material.

16. The device of claim 12, wherein the said material or materials providing discontinuity in a pass in the sheet of 2DEG or high-density electrons provide(s) a tunneling barrier in the pass in the sheet of the 2DEG or high-density electrons.

17. A method to form electrical connection between an electrode and a sheet of 2DEG or high-density electrons with the density of higher than 1e12 $cm^{-2}$; wherein a semiconductor material is placed in between an electrode and the said sheet of 2DEG or high-density electrons; wherein a plane can be drawn tangent to the said sheet of 2DEG or high-density electrons, wherein the said plane intersects the said electrode; wherein the minimum distance between the said electrode and the said sheet of 2DEG or high-density electrons is less than 20 nm.

18. The method of claim 17, wherein the said electrode forms a Schottky contact to the said semiconductor material.

19. A wafer with the area of at least 1 cm2 having at least one heterostructure of compound semiconductor materials, wherein the said wafer has at least two sheets of 2DEG or high-density electrons with the density of higher than 1e12 $cm^{-2}$; wherein the said sheets of 2DEG or high-density electrons are formed by implementing at least two layers of materials.

* * * * *